US009484468B2

(12) United States Patent
Zhang et al.

(10) Patent No.: US 9,484,468 B2
(45) Date of Patent: Nov. 1, 2016

(54) THIN FILM TRANSISTOR AND MANUFACTURING METHOD THEREOF, ARRAY SUBSTRATE, AND DISPLAY APPARATUS

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Yunqi Zhang, Beijing (CN); Sangsoo Park, Beijing (CN); Xunze Zhang, Beijing (CN); Liang Peng, Beijing (CN); Liumin Yu, Beijing (CN); Weihua Fang, Beijing (CN); Yanrui Shen, Beijing (CN); Liang Xiao, Beijing (CN); Daowu Huang, Beijing (CN); Zhiyuan Dong, Beijing (CN); Longlong Duan, Beijing (CN); Jian Wang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/429,940

(22) PCT Filed: Jul. 15, 2014

(86) PCT No.: PCT/CN2014/082241
§ 371 (c)(1),
(2) Date: Mar. 20, 2015

(87) PCT Pub. No.: WO2015/058562
PCT Pub. Date: Apr. 30, 2015

(65) Prior Publication Data
US 2016/0027931 A1 Jan. 28, 2016

(30) Foreign Application Priority Data
Oct. 22, 2013 (CN) .......................... 2013 1 0500440

(51) Int. Cl.
*H01L 29/12* (2006.01)
*H01L 29/786* (2006.01)
(Continued)

(52) U.S. Cl.
CPC ....... *H01L 29/78696* (2013.01); *H01L 27/127* (2013.01); *H01L 27/1225* (2013.01); *H01L 29/24* (2013.01); *H01L 29/7869* (2013.01)

(58) Field of Classification Search
CPC .... H01L 29/12; H01L 31/0256; H01L 29/24
USPC ......................................................... 257/43
See application file for complete search history.

(56) References Cited

U.S. PATENT DOCUMENTS
2008/0296568 A1 12/2008 Ryu et al.
2009/0114921 A1 5/2009 Yamazaki et al.
(Continued)

FOREIGN PATENT DOCUMENTS
CN 1560908 A 1/2005
CN 101621075 A 1/2010
(Continued)

OTHER PUBLICATIONS
Chinese Office Action dated Aug. 5, 2015 issued in corresponding Chinese Application No. 201310500440.9 along with its English translation.
(Continued)

*Primary Examiner* — Tran Tran
(74) *Attorney, Agent, or Firm* — Nath, Goldberg & Meyer; Joshua Goldberg; Christopher Thomas

(57) ABSTRACT

The present invention provides a thin film transistor and a manufacturing method thereof, an array substrate, and a display apparatus. The thin film transistor of the present invention comprises a gate, a gate insulation layer, a semiconductor active region, and a source and a drain connected with the semiconductor active region, and further comprises a surface charge transfer layer in contact with the semiconductor active region, the surface charge transfer layer is located above or below the semiconductor active region, and is used for causing the semiconductor active region to generate a large number of holes or electrons therein without changing the lattice structure of the semiconductor active region. In the thin film transistor, charge transfer occurs between the semiconductor active region and the surface charge transfer layer so that the doped semiconductor active region is formed, thus the performance of the thin film transistor is significantly improved.

10 Claims, 4 Drawing Sheets

(51) Int. Cl.
*H01L 27/12* (2006.01)
*H01L 29/24* (2006.01)

(56) References Cited

U.S. PATENT DOCUMENTS

2009/0321731 A1* 12/2009 Jeong .................. H01L 29/4908
257/43
2011/0297217 A1    12/2011 Barkhouse et al.
2012/0211705 A1     8/2012 Ueno et al.

FOREIGN PATENT DOCUMENTS

| CN | 101621076 A | 1/2010 |
| CN | 102299182 A | 12/2011 |
| CN | 103531639 A | 1/2014 |
| FR | 2 537 781 A1 | 6/1984 |
| JP | 2005166729 A | 6/2005 |
| JP | 2010226101 A | 10/2010 |

OTHER PUBLICATIONS

International Search Report dated May 15, 2014 corresponding to application No. PCT/CN2014/082241.
Third Office Action dated May 24, 2016 issued in corresponding Chinese Application No. 201310500440.9.
Extended European Search Report dated May 24, 2016 issued in corresponding European Application No. 14 85 6040.

* cited by examiner

US 9,484,468 B2

THIN FILM TRANSISTOR AND MANUFACTURING METHOD THEREOF, ARRAY SUBSTRATE, AND DISPLAY APPARATUS

This is a National Phase Application filed under 35 U.S.C. 371 as a national stage of PCT/CN2014/082241, filed Jul. 15, 2014, an application claiming the benefit of Chinese Application No. 201310500440.9, filed Oct. 22, 2013, the content of each of which is hereby incorporated by reference in its entirety.

FIELD OF THE INVENTION

The present invention relates to the technical field of manufacturing technology of display apparatus, and particularly relates to a thin film transistor and a manufacturing method thereof, an array substrate, and a display apparatus.

BACKGROUND OF THE INVENTION

Currently, in order to improve performance of a thin film transistor, impurity ions are generally doped into a semiconductor active region of the thin film transistor so that the semiconductor active region is converted into a P-doped or N-doped semiconductor active region, thereby lifetime of carriers in the semiconductor active region is longer, mobility of the carriers is higher, and the performance of the thin film transistor is improved.

Traditionally, ion implantation doping method is used for semiconductor doping. Ion implantation is performed by accelerating impurity ions in a vacuum and low temperature environment so that the impurity ions obtaining large kinetic energy may directly enter into material of the semiconductor active region, thus the semiconductor active region is converted into a doped semiconductor active region, meanwhile, integrity and periodicity of lattices of the material of the semiconductor active region itself may also be destroyed, resulting in the fact that some lattice defects may occur in the semiconductor active region, lifetime and mobility of the carriers are affected, and improvement of performance of the thin film transistor is limited.

SUMMARY OF THE INVENTION

In view of the above defects existing in the doped semiconductor thin film transistor in the prior art, an object of the present invention is to provide an improved thin film transistor and a manufacturing method thereof, an array substrate, and a display apparatus.

In order to achieve the above object, the present invention provides a thin film transistor, comprising a gate, a gate insulation layer, a semiconductor active region, and a source and a drain connected with the semiconductor active region, the thin film transistor further comprises a surface charge transfer layer in contact with the semiconductor active region, the surface charge transfer layer is located above or below the semiconductor active region, and is used for causing the semiconductor active region to generate a large number of holes or electrons therein without changing the lattice structure of the semiconductor active region.

Preferably, energy level difference between the lowest unoccupied molecular orbit of material of the surface charge transfer layer and the top of valence band of material of the semiconductor active region is greater than or equal to −1 eV and less than or equal to 1 eV.

Preferably, energy level difference between the top of valence band of material of the surface charge transfer layer and the lowest unoccupied molecular orbit of material of the semiconductor active region is greater than or equal to −1 eV and less than or equal to 1 eV.

Preferably, the gate is provided on a base, the gate insulation layer covers the gate, the surface charge transfer layer is provided above the gate insulation layer, and the semiconductor active region is provided above the surface charge transfer layer.

Preferably, the gate is provided on a base, the gate insulation layer covers the gate, the semiconductor active region is provided above the gate insulation layer, and the surface charge transfer layer is provided above the semiconductor active region.

Preferably, the surface charge transfer layer and the semiconductor active region are sequentially provided on a base, the gate is provided above the semiconductor active region, and the gate and the semiconductor active region are separated from each other by the gate insulation layer.

Preferably, the semiconductor active region and the surface charge transfer layer are sequentially provided on a base, the gate is provided above the surface charge transfer layer, and the gate and the surface charge transfer layer are separated from each other by the gate insulation layer.

Preferably, the material of the semiconductor active region is zinc oxide.

Preferably, the material of the surface charge transfer layer is molybdenum trioxide.

The present invention also provides a manufacturing method of the above thin film transistor, comprising a step of: forming a pattern of the surface charge transfer layer above or below a pattern of the semiconductor active region.

Preferably, the pattern of the surface charge transfer layer and the pattern of the semiconductor active region are formed by a single patterning process.

The present invention also provides an array substrate comprising the above thin film transistor.

The present invention also provides a display apparatus comprising the above array substrate.

In the thin film transistor of the present invention, by causing charge transfer to occur between the semiconductor active region and the surface charge transfer layer in contact with the semiconductor active region, a large number of holes or electrons are generated in the semiconductor active region so that the semiconductor active region is converted into a doped semiconductor active region without changing the conductive lattices of the semiconductor active region itself, thus probability that the carriers are captured or scattered during moving in the lattices is greatly lowered, thereby the lifetime of the carriers is longer and the mobility of the carriers is higher, which will facilitate improving of performance of the thin film transistor.

Figure 1:
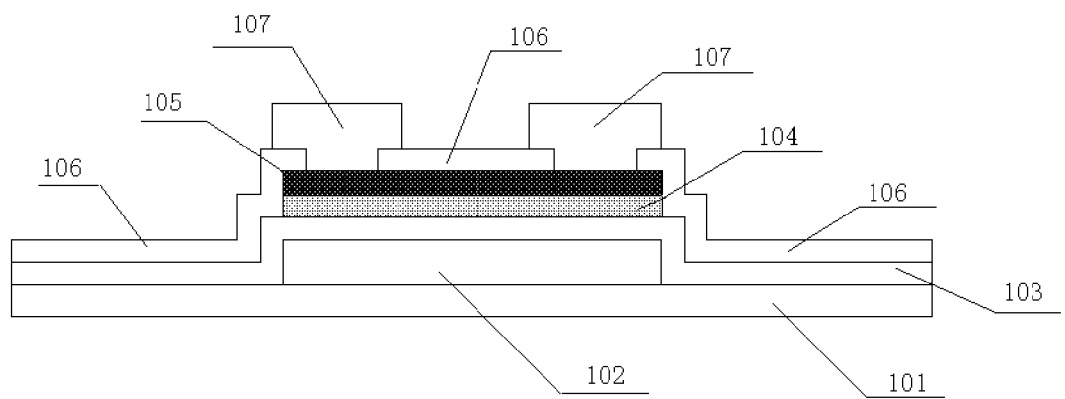
FIG. 1 is a structural diagram of a bottom gate type thin film transistor in accordance with a first embodiment of the present invention.

Reference symbols: 101, base; 102, gate; 103, gate insulation layer; 104, surface charge transfer layer; 105, semiconductor active region; 106, etch stopper; 107, source, drain; 108, data signal line; 109, pixel electrode; 110, passivation layer; 111, common electrode.

DETAILED DESCRIPTION OF THE EMBODIMENTS

In order to make a person skilled in the art better understand the technical solutions of the present invention, the present invention will be described in detail below in combination with the accompanying drawings and specific implementations.

First Embodiment

In conjunction with FIGS. 1, 2, 3 and 4, the present embodiment provides a thin film transistor, comprising a base 101, a gate 102, a gate insulation layer 103, a semiconductor active region 105, and a source and drain 107 connected with the semiconductor active region 105, and the thin film transistor further comprises a surface charge transfer layer 104 in contact with the semiconductor active region 105, wherein, the surface charge transfer layer 104 is located above or below the semiconductor active region 105, and is used for causing the semiconductor active region 105 to generate a large number of holes or electrons therein without changing the lattice structure of the semiconductor active region 105. In the present embodiment, charge transfer occurs between the semiconductor active region 105 and the surface charge transfer layer 104, thus a large number of holes or electrons are generated near the interface where the semiconductor active region 105 and the surface charge transfer layer 104 are in contact with each other, the semiconductor active region 105 is converted into a doped (P-doped or N-doped) semiconductor active region 105. Preferably, energy level difference between the lowest unoccupied molecular orbit (LOMO) of material of the surface charge transfer layer 104 and the top of valence band of material of the semiconductor active region 105 is between −1 eV and 1 eV (including the endpoint values), or, energy level difference between the top of valence band of material of the surface charge transfer layer 104 and the lowest unoccupied molecular orbit of material of the semiconductor active region 105 is between −1 eV and 1 eV (including the endpoint values).

In the thin film transistor of the present embodiment, by causing charge transfer to occur between the semiconductor active region 105 and the surface charge transfer layer 104 in contact with the semiconductor active region 105, a large number of holes or electrons are generated in the semiconductor active region 105 so that the semiconductor active region 105 is converted into a doped semiconductor active region 105 without changing the conductive lattices of the semiconductor active region 105 itself, thus probability that the carriers are captured or scattered during moving in the lattices is greatly lowered, thereby the lifetime of the carriers is longer and the mobility of the carriers is higher, which will facilitate improving of performance of the thin film transistor.

As one structure of the present embodiment, as shown in FIG. 1, preferably, the thin film transistor is a bottom gate type thin film transistor, which preferably comprises: the gate 102, the gate insulation layer 103 covering the gate 102, the surface charge transfer layer 104 provided above the gate insulation layer 103, the semiconductor active region 105 provided above the surface charge transfer layer 104, and the source and drain 107, which are sequentially provided on the base 101, wherein the source and drain 107 are connected with the semiconductor active region 105 through contact holes penetrating through an etch stopper 106 above the semiconductor active region 105.

Figure 2:
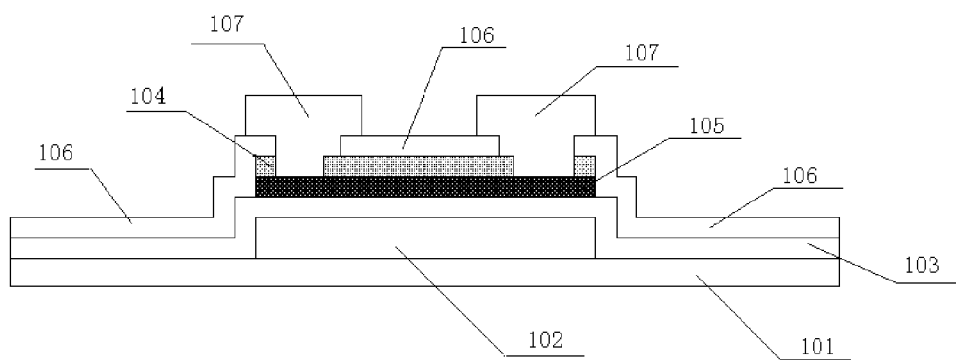
FIG. 2 is another structural diagram of a bottom gate type thin film transistor in accordance with the first embodiment of the present invention.

Of course, as shown in FIG. 2, the thin film transistor may preferably comprise: the gate 102, the gate insulation layer 103 covering the gate 102, the semiconductor active region 105 provided above the gate insulation layer 103, the surface charge transfer layer 104 provided above the semiconductor active region 105, and the source and drain 107, which are sequentially provided on the base 101, wherein the source and drain 107 are connected with the semiconductor active region 105 through contact holes penetrating through the etch stopper 106 and the surface charge transfer layer 104 above the semiconductor active region 105.

Figure 3:
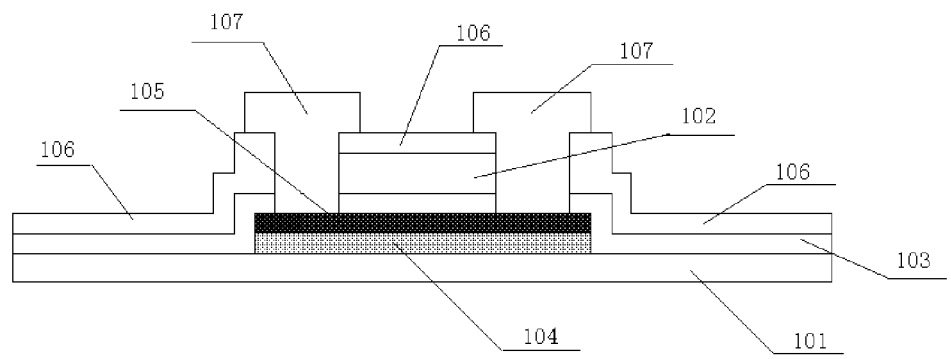
FIG. 3 is a structural diagram of a top gate type thin film transistor in accordance with the first embodiment of the present invention.

As another structure of the present embodiment, as shown in FIG. 3, the thin film transistor is preferably a top gate type thin film transistor, which preferably comprises: the surface charge transfer layer 104, the semiconductor active region 105, and the gate 102 provided above the semiconductor active region 105, which are sequentially provided on the base 101, wherein the gate 102 and the semiconductor active region 105 are separated from each other by the gate insulation layer 103, the etch stopper 106 is provided above the gate 102, the source and drain 107 are provided above the etch stopper 106, and the source and drain 107 are connected with the semiconductor active region 105 through contact holes penetrating through the etch stopper 106 and the gate insulation layer 103.

Figure 4:
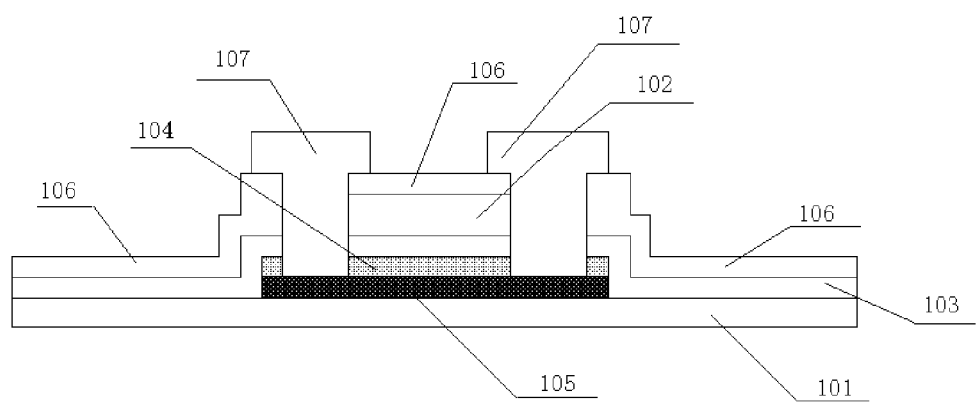
FIG. 4 is another structural diagram of a top gate type thin film transistor in accordance with the first embodiment of the present invention.

Of course, as shown in FIG. 4, the thin film transistor may preferably comprise: the semiconductor active region 105, the surface charge transfer layer 104, and the gate 102 provided above the surface charge transfer layer 104, which are sequentially provided on the base 101, wherein the gate 102 and the surface charge transfer layer 104 are separated from each other by the gate insulation layer 103, the etch stopper 106 is provided above the gate 102, and the source and drain 107 are provided above the etch stopper 106, the source and drain 107 are connected with the semiconductor active region 105 through contact holes penetrating through the etch stopper 106, the gate insulation layer 103 and the surface charge transfer layer 104.

Figure 5:
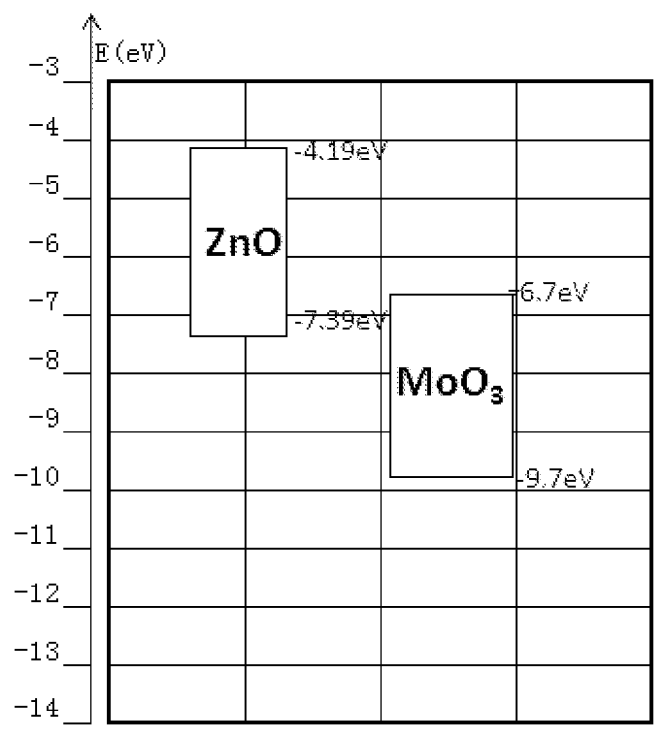
FIG. 5 is a schematic diagram illustrating energy bands of zinc oxide and molybdenum trioxide.
Figure 6:
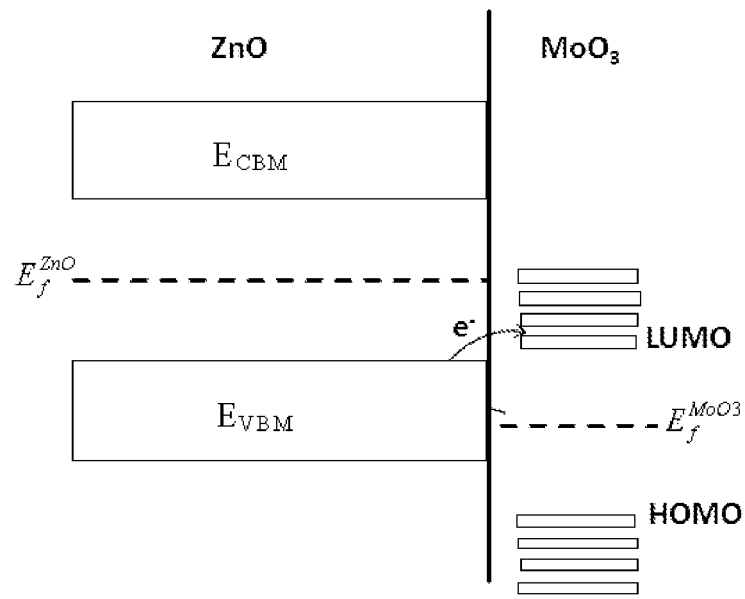
FIG. 6 is a schematic diagram illustrating energy band structures of zinc oxide and molybdenum trioxide before they are in contact with each other.
Figure 7:
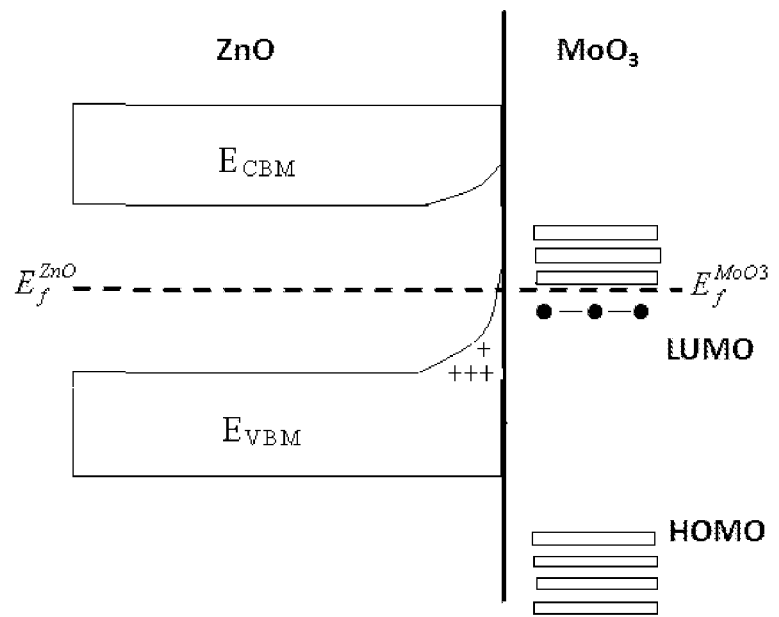
FIG. 7 is a schematic diagram illustrating energy band structures of zinc oxide and molybdenum trioxide after they are in contact with each other.

Preferably, the material of the surface charge transfer layer 104 in the present embodiment is molybdenum trioxide, and the material of the semiconductor active region 105 is zinc oxide Zinc oxide is used as the material of the semiconductor active region 105 so that the resultant thin film transistor has a higher mobility, thus size of the thin film transistor is reduced. A better effect may be achieved by the above combination of molybdenum trioxide and zinc oxide. As shown in FIGS. 5, 6 and 7, FIG. 5 shows a schematic diagram illustrating energy bands of zinc oxide and molybdenum trioxide, FIG. 6 shows a schematic diagram illustrating energy band structures of zinc oxide and molybdenum trioxide before they are in contact with each other, and FIG. 7 shows a schematic diagram illustrating energy band structures of zinc oxide and molybdenum trioxide after they are in contact with each other. As shown in FIG. 5, the energy level of the top of valence band of zinc oxide is −7.39 ev, and the energy level of the lowest unoccupied molecular orbit of molybdenum trioxide is −6.7 ev. In this case, as shown in FIG. 6, electrons at the top of valence band of zinc oxide transfer to the lowest unoccupied molecular orbit of molybdenum trioxide, that is to say, charge transfer occurs at the contact interface between zinc oxide and molybdenum trioxide. Thus, as shown in FIG. 7, a large number of holes are generated in the zinc oxide semiconductor active region 105 near the interface where the semiconductor active region 105 and the molybdenum trioxide surface charge transfer layer 104 are in contact with each other, the intrinsic zinc oxide semiconductor active region 105 is converted into a P-doped zinc oxide semiconductor active region 105. During this procedure, the intrinsic lattices of zinc oxide are maintained and are not changed, thus the probability that the carriers are captured and scattered during moving in the lattices is greatly lowered, thereby the lifetime of the carriers is longer, the mobility of the carriers is higher, which facilitate improving of performance of the thin film transistor.

Of course, the present embodiment is not limited to use of zinc oxide as the material of the semiconductor active region 105 and use of molybdenum trioxide as the material of the surface charge transfer layer 104, as long as a large number of holes or electrons are generated in the semiconductor active region 105 with the surface charge transfer layer 104 without changing the lattice structure of the semiconductor active region 105, in other words, as long as energy level difference between the lowest unoccupied molecular orbit of material of the surface charge transfer layer 104 and the top of valence band of material of the semiconductor active region 105 is greater than or equal to −1 eV and less than or equal to 1 eV, or, energy level difference between the top of valence band of material of the surface charge transfer layer 104 and the lowest unoccupied molecular orbit of material of the semiconductor active region 105 is greater than or equal to −1 eV and less than or equal to 1 eV.

Second Embodiment

The present embodiment provides a manufacturing method of the thin film transistor in the first embodiment. The thin film transistor may be of top gate type or bottom gate type. An example in which the thin film transistor is of bottom gate type and the surface charge transfer layer 104 is provided below the semiconductor active region 105 will be described specifically below. The manufacturing method comprises following steps.

Step 1, forming a pattern of the gate 102 on the base 101 by sputtering, exposure, development, etching, stripping, etc. In the present embodiment, the gate 102 may be a monolayer or multilayer composite stack layer formed of one or more of molybdenum (Mo), alloy of molybdenum and niobium (MoNb), aluminum (Al), alloy of aluminum and neodymium (AlNd), titanium (Ti) and copper (Cu), and preferably, is a monolayer or multilayer composite stack layer formed of Mo, Al or alloy containing Mo, Al, and the thickness thereof is between 100 nm and 500 nm.

Step 2, forming the gate insulation layer 103 above the gate 102 by plasma enhanced chemical vapor deposition (PECVD), etc. The gate insulation layer 103 may be a multilayer composite film formed of one or two of silicon oxide (SiOx), silicon nitride (SiNx), hafnium oxide (HfOx), silicon oxynitride (SiON), aluminum oxide (AlOx), etc., the thickness thereof is between 100 nm and 600 nm, and the thickness may be adjusted in accordance with actual conditions.

Step 3, sequentially depositing a transition insulation material layer, a semiconductor material layer above the gate insulation layer 103, and simultaneously forming a pattern of the surface charge transfer layer 104 and a pattern of the semiconductor active region 105 by performing exposure, development, etching, stripping, etc once. The surface charge transfer layer 104 and the semiconductor active region 105 are formed by a single patterning process, so that the cost is reduced and the productivity is improved. Of course, the pattern of the surface charge transfer layer 104 and the pattern of the semiconductor active region 105 may be formed by two steps. Preferably, the material of the surface charge transfer layer 104 is molybdenum trioxide, and the material of the semiconductor active region 105 is zinc oxide, of course, as long as energy level difference between the lowest unoccupied molecular orbit of material of the surface charge transfer layer 104 and the top of valence band of material of the semiconductor active region 105 is greater than or equal to −1 eV and less than or equal to 1 eV, or, energy level difference between the top of valence band of material of the surface charge transfer layer 104 and the lowest unoccupied molecular orbit of material of the semiconductor active region 105 is greater than or equal to −1 eV and less than or equal to 1 eV.

Step 4, forming the etch stopper (ESL) 106 above the semiconductor active region 105 by sputtering, exposure, development, etching, stripping, etc. The etch stopper 106 may be a multilayer film formed of two or three of silicon oxide (SiOx), silicon nitride (SiNx), hafnium oxide (HfOx), silicon oxynitride (SiON), aluminum oxide (AlOx), etc.

Step 5, forming the source and drain 107 above the etch stopper 106 by sputtering, exposure, development, etching, stripping, etc., and the source and drain 107 are connected with the oxide semiconductor active region 105 through contact holes penetrating through the etch stopper 106. The source and drain 107 may be a monolayer or multilayer composite stack layer formed of one or more of molybdenum (Mo), alloy of molybdenum and niobium (MoNb), aluminum (Al), alloy of aluminum and neodymium (AlNd), titanium (Ti) and copper (Cu), and preferably, is a monolayer or multilayer composite stack layer formed of Mo, Al or alloy containing Mo, Al.

Step 6, forming a passivation layer above the source and drain 107. In the present embodiment, the passivation layer may be formed of one or several of silicon oxide (SiOx), silicon nitride (SiNx), hafnium oxide (HfOx), silicon oxynitride (SiON), aluminum oxide (AlOx) and organic material.

The example in which a bottom gate type thin film transistor is manufactured is described in the present embodiment. In this thin film transistor, by causing charge transfer to occur between the semiconductor active region 105 and the surface charge transfer layer 104, a large number of holes or electrons are generated in the semiconductor active region 105 so that the semiconductor active region 105 is converted into a doped semiconductor active region 105 without changing the conductive lattices of the semiconductor active region 105 itself, thus probability that the carriers are captured or scattered during moving in the lattices is greatly lowered, thereby the lifetime of the carriers is longer and the mobility of the carriers is higher, which will facilitate improving of performance of the thin film transistor.

The manufacturing method of the bottom gate type thin film transistor in which the semiconductor active region 105 is provided below the surface charge transfer layer 104 is similar to the above method, the difference is in that: a transition insulation material layer and a semiconductor material layer are sequentially deposited on the base formed with the gate insulation layer 103. The surface charge transfer layer 104 and the semiconductor active region 105 of the top gate type thin film transistor are formed by a method similar to the method in the present embodiment, the difference is in that: the semiconductor active region 105 and the surface charge transfer layer 104 of the top gate type thin film transistor are formed before the gate insulation layer 103 is formed, and other steps are substantially the same and will not be repeated here.

Third Embodiment

Figure 8:
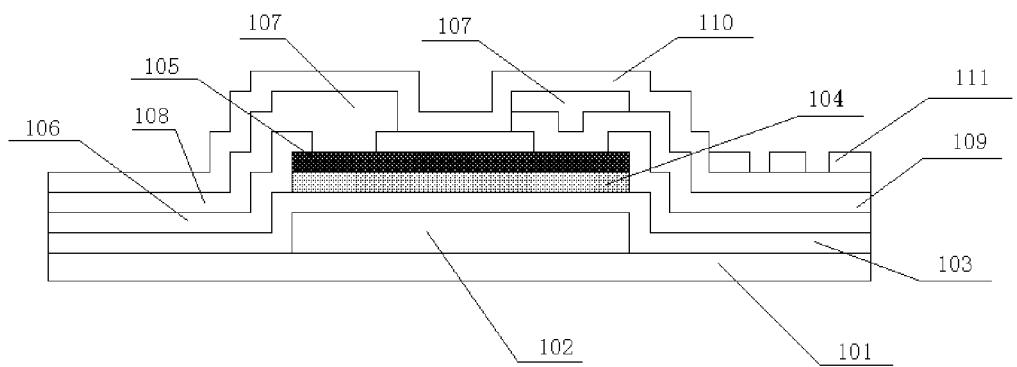
FIG. 8 is a structural diagram of an array substrate in accordance with a third embodiment of the present invention.

In conjunction with FIG. 8, the present embodiment provides an array substrate comprising the thin film transistor of the first embodiment, wherein the source 107 of the thin film transistor is connected with a data signal line 108, and the drain 107 of the thin film transistor is connected with a pixel electrode 109.

Taking the array substrate in a liquid crystal display apparatus of ADvanced super dimension switch (ADS) mode as an example, the array substrate further comprises a mesh-shaped common electrode 111, the pixel electrode 109 and the common electrode 111 are separated from each other by a passivation layer 110, a first electrode of a storage capacitor is integrated with the pixel electrode 109 as a whole, and a second electrode of the storage capacitor is integrated with the common electrode 111 as a whole.

Of course, the pixel electrode 109 may be a mesh-shaped electrode, and the common electrode 111 is a plate-shaped electrode.

Preferably, the data signal line 108 and the source and drain 107 are formed synchronously. In this case, the cost is reduced, and the productivity is improved.

Preferably, material of the pixel electrode 109 and the common electrode 111 is indium tin oxide (ITO) or graphene, or may be any other transparent conductive material.

It should be noted that, although the array substrate in the liquid crystal display apparatus of ADS mode is taken as an example in the above embodiments, the present invention is not limited to the array substrate in the liquid crystal display apparatus of ADS mode, and even is not limited to the array substrate in the liquid crystal display device. For example, the present invention may be applied to the array substrate in the liquid crystal display device of IPS (in-plane switch) mode, the array substrate in the OLED (organic light emitting diode) display device, and the like.

Fourth Embodiment

The present embodiment provides a manufacturing method of the array substrate in the third embodiment, wherein the manufacturing of the thin film transistor is the same as that in the second embodiment, while forming the thin film transistor, the manufacturing method further comprises following steps.

Step 7, forming a pattern of the pixel electrode 109 (i.e., the first electrode of the storage capacitor) above the contact holes for connecting the drain 107 and the semiconductor active region 105 of the thin film transistor by a patterning process, wherein the material of the pixel electrode 109 (the first electrode of the storage capacitor) is a conductive material of indium tin oxide, graphene, or the like.

Step 8, forming the source and drain 107 of the thin film transistor on the base 101 subjected to the above step, and meanwhile, forming the data signal line 108 connected with the source 107.

Of course, the above two steps may be performed by a single patterning process. Specifically, a pixel electrode material layer is deposited above the contact holes for connecting the drain 107 and the semiconductor active region 105 of the thin film transistor, then a source and drain metal layer is deposited above the contact holes for connecting the source 107 and the semiconductor active region 105 of the thin film transistor and above the pixel electrode material layer, a pattern including the source 107, the drain 107, the data signal line 108 connected with the source 107, and the pixel electrode 109 connected with the drain 107 are formed by exposure, development, etching, stripping, etc. Since the source and drain 107, the data signal line 108 and the pixel electrode 109 are formed by a single patterning process, the productivity is improved and the cost is reduced.

The passivation layer 110 is formed on the base 101 subjected to the above steps, and a pattern of the common electrode 111 (i.e., the second electrode of the storage capacitor) is formed by a patterning process, wherein the material of the common electrode 111 (the second electrode of the storage capacitor) is a conductive material of indium tin oxide, graphene, or the like.

As an example, in the present embodiment, the pixel electrode 109 is first prepared, and then the common electrode 111 is manufactured. Of course, it is also feasible that the common electrode 111 is first prepared and then the pixel electrode 109 is manufactured, which is also within the scope of the present invention.

Fifth Embodiment

The present embodiment provides a display apparatus comprising the array substrate of the third embodiment. The display apparatus may be any product or member with display function, such as phone, tablet computer, TV, monitor, notebook computer, digital photo frame, and navigator.

The display apparatus of the present embodiment comprises the array substrate of the third embodiment, thus the performance of the thin film transistor therein is significantly improved, and the performance of the display apparatus is also improved.

Of course, the display apparatus of the present embodiment may further comprise other conventional structures such as a power source, a display drive unit and so on.

It should be understood that, the above implementations are merely exemplary implementations adopted for describing the principle of the present invention, rather than limiting the present invention. Various variations and improvements may be made for those of ordinary skill in the art without departing from the spirit and essence of the present invention, and these variations and improvements are regarded within the protection scope of the present invention.

The invention claimed is:

1. A thin film transistor, comprising: a gate, a gate insulation layer, a semiconductor active region, and a source and a drain connected with the semiconductor active region, wherein the thin film transistor further comprises a surface charge transfer layer in contact with the semiconductor active region, the surface charge transfer layer is located above or below the semiconductor active region, and is used for causing the semiconductor active region to generate a large number of holes or electrons therein without changing the lattice structure of the semiconductor active region;

wherein energy level difference between the lowest unoccupied molecular orbit of material of the surface charge transfer layer and the top of valence band of material of the semiconductor active region is greater than or equal to −1 eV and less than or equal to 1 eV; or wherein energy level difference between the top of valence band of material of the surface charge transfer layer and the lowest unoccupied molecular orbit of material of the semiconductor active region is greater than or equal to −1 eV and less than or equal to 1 eV.

2. The thin film transistor of claim 1, wherein the gate is provided on a base, the gate insulation layer covers the gate, the surface charge transfer layer is provided above the gate insulation layer, and the semiconductor active region is provided above the surface charge transfer layer.

3. The thin film transistor of claim 1, wherein the gate is provided on a base, the gate insulation layer covers the gate, the semiconductor active region is provided above the gate insulation layer, and the surface charge transfer layer is provided above the semiconductor active region.

4. The thin film transistor of claim 1, wherein the surface charge transfer layer and the semiconductor active region are sequentially provided on a base, the gate is provided above the semiconductor active region, and the gate and the semiconductor active region are separated from each other by the gate insulation layer.

5. The thin film transistor of claim 1, wherein the semiconductor active region and the surface charge transfer layer are sequentially provided on a base, the gate is provided above the surface charge transfer layer, and the gate and the surface charge transfer layer are separated from each other by the gate insulation layer.

6. The thin film transistor of claim 1, wherein the material of the semiconductor active region is zinc oxide.

7. The thin film transistor of claim 6, wherein the material of the surface charge transfer layer is molybdenum trioxide.

8. A manufacturing method of the thin film transistor of claim 1, comprising a step of: forming a pattern of the surface charge transfer layer above or below a pattern of the semiconductor active region.

9. The manufacturing method of claim 8, wherein the pattern of the surface charge transfer layer and the pattern of the semiconductor active region are formed by a single patterning process.

10. An array substrate, comprising the thin film transistor of claim 1.

* * * * *